(12) United States Patent
Wang et al.

(10) Patent No.: US 12,225,700 B2
(45) Date of Patent: *Feb. 11, 2025

(54) DISPLAY PANEL, DISPLAY MODULE AND COMMUNICATION DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Wang, Beijing (CN); Binfeng Feng, Beijing (CN); Yonghui Luo, Beijing (CN); Fei Li, Beijing (CN); Yupeng Chen, Beijing (CN); Jiaxiang Wang, Beijing (CN); Zijie Zhang, Beijing (CN); Qifeng Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/419,131

(22) Filed: Jan. 22, 2024

(65) Prior Publication Data

US 2024/0164076 A1     May 16, 2024

Related U.S. Application Data

(63) Continuation of application No. 16/957,069, filed as application No. PCT/CN2019/103011 on Aug. 28, 2019, now Pat. No. 11,925,010.

(51) Int. Cl.
*H04M 1/04*      (2006.01)
*H01Q 1/24*      (2006.01)
(Continued)

(52) U.S. Cl.
CPC .......... *H05K 9/0081* (2013.01); *H01Q 1/243* (2013.01); *H01Q 1/52* (2013.01); *H05K 7/20963* (2013.01)

(58) Field of Classification Search
CPC .. H05K 9/0081; H05K 7/20963; H01Q 1/243; H01Q 1/52
See application file for complete search history.

(56) References Cited

U.S. PATENT DOCUMENTS

2008/0123272 A1   5/2008   Kang
2008/0170359 A1*   7/2008   Kim .................. H05K 7/20963
                                                  361/752

(Continued)

FOREIGN PATENT DOCUMENTS

CN      102006766 A      4/2011
CN      105579944 A      5/2016

(Continued)

OTHER PUBLICATIONS

ISA China National Intellectual Property Administration, International Search Report and Written Opinion Issued in Application No. PCT/CN2019/103011, Jun. 3, 2020, WIPO, 15 pages.

(Continued)

*Primary Examiner* — Moustapha Diaby
(74) *Attorney, Agent, or Firm* — McCoy Russell LLP

(57) ABSTRACT

A display panel, a display module and a manufacture method thereof, and a communication device are provided. The display panel includes a display substrate and a multiplexing circuit arranged on a first surface of the display substrate. The display panel further includes a wave-absorbing material layer arranged on a second surface of the display substrate. The wave-absorbing material layer is configured to absorb electromagnetic wave interference signals. The second surface is a surface opposite to the first surface.

13 Claims, 14 Drawing Sheets

(51) Int. Cl.
  *H01Q 1/52* (2006.01)
  *H05K 7/20* (2006.01)
  *H05K 9/00* (2006.01)

(56) References Cited

U.S. PATENT DOCUMENTS

| | | | | |
|---|---|---|---|---|
| 2008/0297021 | A1* | 12/2008 | Hwang | H01J 9/205 |
| | | | | 445/24 |
| 2010/0181574 | A1* | 7/2010 | Liu | H01L 27/1229 |
| | | | | 438/149 |
| 2013/0284982 | A1* | 10/2013 | Chen | C09D 5/24 |
| | | | | 252/478 |
| 2014/0118969 | A1 | 5/2014 | Lee | |
| 2015/0268759 | A1 | 9/2015 | Ludden et al. | |
| 2016/0064421 | A1* | 3/2016 | Oh | H01L 27/1218 |
| | | | | 257/43 |
| 2016/0379906 | A1* | 12/2016 | Kim | G09G 3/3688 |
| | | | | 257/48 |
| 2017/0367175 | A1* | 12/2017 | Lai | H05K 1/0203 |
| 2019/0073961 | A1* | 3/2019 | Park | G02F 1/1362 |
| 2020/0020272 | A1* | 1/2020 | Huang | G02F 1/13452 |
| 2020/0035644 | A1* | 1/2020 | Choi | H01L 23/552 |
| 2020/0209387 | A1* | 7/2020 | Yeon | G01S 15/04 |
| 2024/0164076 | A1* | 5/2024 | Wang | H01L 27/124 |

FOREIGN PATENT DOCUMENTS

| | | |
|---|---|---|
| CN | 106648204 A | 5/2017 |
| CN | 108682369 A | 10/2018 |
| CN | 109559640 A | 4/2019 |
| KR | 100823192 B1 | 4/2008 |

OTHER PUBLICATIONS

State Intellectual Property Office of the People's Republic of China, Office Action and Search Report Issued in Application No. 201980001532.8, Apr. 1, 2022, 22 pages. (Submitted with Partial Translation).

European Patent Office, Extended European Search Report Issued in Application No. 19929188.1, Aug. 18, 2022, Germany, 10 pages.

United States Patent and Trademark Office, Non-Final Office Action Issued in U.S. Appl. No. 16/957,069, filed Jul. 20, 2023, 28 pages.

United States Patent and Trademark Office, Notice of Allowance Issued in U.S. Appl. No. 16/957,069, filed Nov. 15, 2023, 8 pages.

* cited by examiner

DISPLAY PANEL, DISPLAY MODULE AND COMMUNICATION DEVICE

CROSS-REFERENCE TO RELATED APPLICATIONS

This application is a continuation application of the U.S. Non-Provisional patent application Ser. No. 16/957,069, entitled "DISPLAY PANEL, DISPLAY MODULE AND MANUFACTURE METHOD THEREOF, AND COMMUNICATION DEVICE", and filed on Jun. 22, 2020, which is the U.S. National Phase Application of a PCT Application No. PCT/CN2019/103011 filed on Aug. 28, 2019. The disclosure of each of the above-referenced applications are incorporated in their entirety by reference herein.

TECHNICAL FIELD

The present disclosure relates to the field of display techniques, in particular to a display panel, a display module and a manufacture method thereof, and a communication device.

BACKGROUND

Full-screen mobile phones represent a trend in current development of mobile phones. As the screen of a full-screen mobile phone occupies a large proportion of space, the driver integrated circuit (IC) for driving the mobile phone screen is relatively close to the antenna of the mobile phone. In the related art, a multiplexing (MUX) circuit is used to multiplex the driving signal output by the driver IC, and the multiplexing circuit adjoins the driver IC, so that the multiplexing circuit is also relatively close to the antenna of the mobile phone. The electromagnetic wave interference signals generated by the multiplexing circuit propagates along the display substrate, and significantly interferes with radio frequency signals of the antenna of the mobile phone if the multiplexing circuit is relatively close to the antenna.

In the related art, a shielding material layer is typically provided on the area where the driver IC and the multiplexing circuit are arranged, to prevent interference with the antenna of the mobile phone. However, in this way, when the conductive cloth is attached to the area where the driver IC and the multiplexing circuit are arranged, it tends to be loosely attached, and the electromagnetic wave interference signals generated by the multiplexing circuit may propagate inside the display substrate, resulting in poor consistency of the radio frequency metrics of mobile phones. Also, the operation process is complicated, which affects the working efficiency.

SUMMARY

In a first aspect, the present disclosure provides, in some embodiments, a display panel including a display substrate and pixel units, where the multiplexing circuit and the pixel units are arranged on a first surface of the display substrate, the display panel further includes a wave-absorbing material layer arranged on a second surface of the display substrate; the wave-absorbing material layer is configured to absorb an electromagnetic wave interference signals; the second surface is a surface opposite to the first surface; the multiplexing circuit includes N input pins and M output pins, where N is different from M, and N and M both are positive integers; and the input pins are connected to a driver integrated circuit and the output pins are connected to the pixel units.

Optionally, the first surface includes a display region and a peripheral region at a periphery of the display region, the second surface includes a first region and a second region; an orthographic projection of the display region onto the second surface overlaps the first region, and an orthographic projection of the peripheral region onto the second surface overlaps the second region; the multiplexing circuit is arranged in the peripheral region; the display panel further includes a first back film layer arranged in the first region of the second surface; and the wave-absorbing material layer is arranged on a side of the first back film layer that is far away from the display panel.

Optionally, the display panel according to at least one embodiment of the present disclosure further includes a first heat-dissipation film layer, where the first heat-dissipation film layer and the wave-absorbing material layer are arranged at a same level, and an orthographic projection of the first heat-dissipation film layer onto the second surface and an orthographic projection of the wave-absorbing material layer onto the second surface are both in the first region.

Optionally, the display panel according to at least one embodiment of the present disclosure further includes a second heat-dissipation film layer, where the second heat-dissipation film layer is arranged on a side of the first heat-dissipation film layer that is far away from the first back film layer; an orthographic projection of the second heat-dissipation film layer onto the second surface at least covers an orthographic projection of the first heat-dissipation film layer onto the second surface and an orthographic projection of the wave-absorbing material layer onto the second surface.

Optionally, a thickness of the first heat-dissipation film layer is substantially equal to a thickness of the wave-absorbing material layer, the thickness of the first heat-dissipation film layer is substantially equal to a thickness of the first back film layer, the thickness of the first heat-dissipation film layer is greater than a thickness of the second heat-dissipation film layer, and the thickness of the second heat-dissipation film layer is greater than a thickness of the display substrate.

Optionally, a thickness of the first back film layer is greater than or equal to 0.05 mm and less than or equal to 0.1 mm, a thickness of the wave-absorbing material layer is greater than or equal to 0.03 mm and less than or equal to 0.15 mm, a thickness of the first heat-dissipation film layer is greater than or equal to 0.08 mm and less than or equal to 0.15 mm, a thickness of the second heat-dissipation film layer is greater than or equal to 0.03 mm and less than or equal to 0.05 mm, and a thickness of the display substrate is greater than or equal to 0.02 mm and less than or equal to 0.05 mm.

Optionally, the display panel according to at least one embodiment of the present disclosure further includes a first heat-dissipation film layer and a second heat-dissipation film layer; the first heat-dissipation film layer is arranged between the first back film layer and the wave-absorbing material layer; the second heat-dissipation film layer and the wave-absorbing material layer are arranged at a same level, and an orthographic projection of the first heat-dissipation film layer onto the second surface at least covers an orthographic projection of the second heat-dissipation film layer onto the second surface and an orthographic projection of the wave-absorbing material layer onto the second surface.

Optionally, a thickness of the wave-absorbing material layer is substantially equal to a thickness of the second heat-dissipation film layer, a thickness of the first heat-dissipation film layer is substantially equal to a thickness of the first back film layer, the thickness of the first heat-dissipation film layer is greater than the thickness of the second heat-dissipation film layer, and the thickness of the second heat-dissipation film layer is greater than a thickness of the display substrate.

Optionally, a thickness of the wave-absorbing material layer is greater than or equal to 0.03 mm and less than or equal to 0.15 mm, a thickness of the second heat-dissipation film layer is greater than or equal to 0.03 mm and less than or equal to 0.05 mm, a thickness of the first heat-dissipation film layer is greater than or equal to 0.08 mm and less than or equal to 0.15 mm, a thickness of the first back film layer is greater than or equal to 0.05 mm and less than or equal to 0.1 mm, and a thickness of the display substrate is greater than or equal to 0.02 mm and less than or equal to 0.05 mm.

Optionally, the first surface includes a display region and a peripheral region at a periphery of the display region; the second surface includes a first region and a second region, an orthographic projection of the display region onto the second surface overlaps the first region, an orthographic projection of the peripheral region onto the second surface overlaps the second region; and the wave-absorbing material layer is arranged in the first region and the multiplexing circuit is arranged in the peripheral region.

Optionally, the wave-absorbing material layer includes one or more of a ferrite layer, a magnetic ferrous nanomaterial layer, a carbon fiber layer, a carbon nanotube layer, or a silicon carbide layer.

Optionally, the display panel according to at least one embodiment of the present disclosure further includes a first back film layer, where the first back film layer is arranged on a part of the second surface, the first back film layer and the wave-absorbing material layer are arranged at a same level, and the first back film layer is arranged in the first region.

Optionally, the first back film layer and the wave-absorbing material layer contact each other laterally.

Optionally, the display panel according to at least one embodiment of the present disclosure further includes a heat dissipation layer, where the heat dissipation layer is arranged on a side of the first back film layer that is far away from the display substrate.

Optionally, a thickness of the heat dissipation layer is greater than a thickness of the first back film layer, a thickness of the wave-absorbing material layer is substantially equal to the thickness of the first back film layer, and the thickness of the first back film layer is greater than a thickness of the display substrate.

Optionally, a thickness of the first back film layer is greater than or equal to 0.05 mm and less than or equal to 0.1 mm, a thickness of the wave-absorbing material layer is greater than or equal to 0.03 mm and less than or equal to 0.15 mm, a thickness of the display substrate is greater than or equal to 0.02 mm and less than or equal to 0.05 mm, and a thickness of the heat dissipation layer is greater than or equal to 0.11 mm and less than or equal to 0.2 mm.

Optionally, the display substrate is a flexible display substrate; the first surface includes a display region and a peripheral region at a periphery of the display region; the second surface includes a first region and a second region; an orthographic projection of the display region onto the second surface overlaps the first region, an orthographic projection of the peripheral region onto the second surface overlaps the second region; the multiplexing circuit is arranged in the peripheral region; and the second region includes a bent region and a non-bent region; the bent region is arranged between the non-bent region and the first region; and the wave-absorbing material layer is arranged in the non-bent region.

Optionally, the display panel according to at least one embodiment of the present disclosure further includes an upper antenna and a lower antenna and a plurality of data lines longitudinally arranged on the display substrate; where the upper antenna is arranged above the display substrate and the lower antenna is arranged below the display substrate; data voltage signals provided by the multiplexing circuit are output through the data lines, and the wave-absorbing material layer is used to absorb the electromagnetic wave interference signals generated by the multiplexing circuit.

In a second aspect, the present disclosure provides, in some embodiments, a display module including a multiplexing circuit and the display panel described above, where the multiplexing circuit is arranged on the first surface of the display substrate included in the display panel.

Optionally, the display module according to at least one embodiment of present disclosure further includes a driver integrated circuit, where the driver integrated circuit is arranged on a side of the multiplexing circuit that is far away from the display substrate.

Optionally, the display module according to at least one embodiment of the present disclosure further includes a bottom adhesive tape layer, a polarizer layer, a top adhesive tape layer, and a cover plate; where the bottom adhesive tape layer, the polarizer layer, the top adhesive tape layer, and the cover plate are arranged sequentially on a side of the display substrate that is far away from the first back film layer.

In a third aspect, the present disclosure provides, in some embodiments, a manufacture method of a display module, including: arranging a multiplexing circuit on a first surface of a display substrate; and forming a wave-absorbing material layer on a second surface of the display substrate, where the wave-absorbing material layer is configured to absorb electromagnetic wave interference signals, and the second surface is a surface opposite to the first surface.

In a fourth aspect, the present disclosure provides, in some embodiments, a communication device including the display module described above.

DETAILED DESCRIPTION

The technical solutions in the embodiments of the present disclosure will be described clearly and completely in conjunction with the drawings in the embodiments of the present disclosure. Obviously, the described embodiments are only some of the embodiments of the present disclosure, but not all the embodiments. Based on the embodiments in the present disclosure, all other embodiments obtained by those of ordinary skill in the art without creative efforts shall fall within the scope of the present disclosure.

A display panel according to at least one embodiment of the present disclosure includes a display substrate and pixel units, where a multiplexing circuit and the pixel units are arranged on a first surface of the display substrate, the display panel further includes a wave-absorbing material layer arranged on a second surface of the display substrate; the wave-absorbing material layer is configured to absorb electromagnetic wave interference signals; the second surface is a surface opposite to the first surface; the multiplexing circuit includes N input pins and M output pins, where N is different from M, and N and M both are positive integers; and the input pins are connected to a driver integrated circuit and the output pins are connected to the pixel units.

In the display panel according to at least one embodiment of the present disclosure, a wave-absorbing material layer for absorbing electromagnetic wave interference signals is provided on the second surface of the display substrate, to absorb the electromagnetic wave interference signals generated by the multiplexing circuit and convert the electromagnetic wave interference signals into heat to be dissipated, thereby preventing the impact of the electromagnetic wave interference signals on reception of communication signals by the antenna included in the communication device. During practical operation, the display substrate may be a flexible display substrate.

In a specific implementation, the input pins of the multiplexing circuit are connected to the driver integrated circuit, and the output pins of the multiplexing circuit are connected to the pixel units through data lines. The driver integrated circuit is used to provide a data voltage, and the data lines may be arranged on the first surface of the display substrate.

Figure 1A:
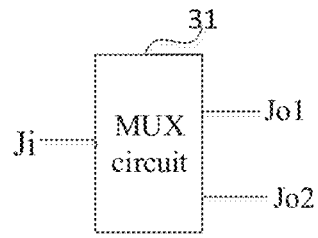
FIG. 1A is a structural view of a multiplexing circuit according to an embodiment.

Optionally, M may be greater than N. For example, as shown in FIG. 1A, in at least one embodiment of the multiplexing circuit, M may be equal to 2, and N may be equal to 1.

The multiplexing circuit 31 includes an input pin Ji, a first output pin Jo1, and a second output pin Jo2. The input pin Ji is in connection with the first output pin Jo1 and the second output pin Jo2 in a time-divided manner.

In at least one embodiment of the present disclosure, the multiplexing circuit is arranged on the first surface (i.e., the display surface) of the display substrate and the pixel units are also arranged on the first surface. As the first surface cannot accommodate a wave-absorbing material layer of a large area, the wave-absorbing material layer is arranged on the second surface of the display substrate.

Figure 1B:
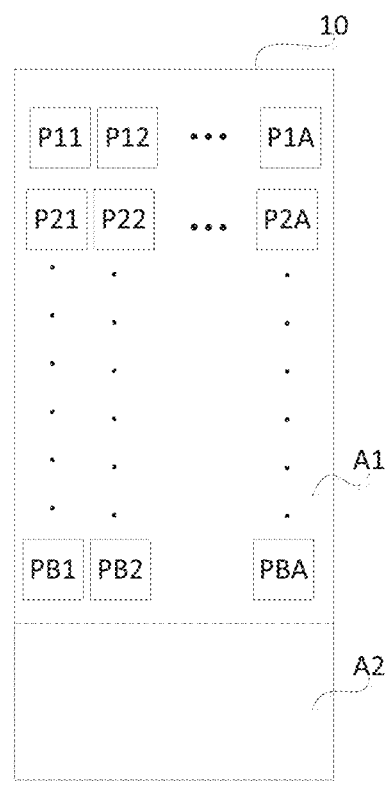
FIG. 1B is a schematic view of a region included in a first surface of a display substrate in a display panel according to at least one embodiment of the present disclosure.

In a specific implementation, as shown in FIG. 1B, the first surface of the display substrate 10 includes a display region A1 and a peripheral region A2 at a periphery of the display region A1. As shown in FIG. 1B, the pixel units are arranged in the display region A1. In FIG. 1B, the pixel unit in the first row and first column is denoted as P11, the pixel unit in the first row and second column is denoted as P12, the pixel unit in the first row and A-th column is denoted as NA, the pixel unit in the second row and first column is denoted as P21, the pixel unit in the second row and second column is denoted as P22, the pixel unit in the second row and A-th column is denoted as P2A, the pixel unit in the B-th row and first column is denoted as PB1, the pixel unit in the B-th row and second column is denoted as PB2, and the pixel unit in the B-th row and A-th column is denoted as PBA, where A is an integer greater than 2 and B is an integer greater than 2.

Figure 2A:
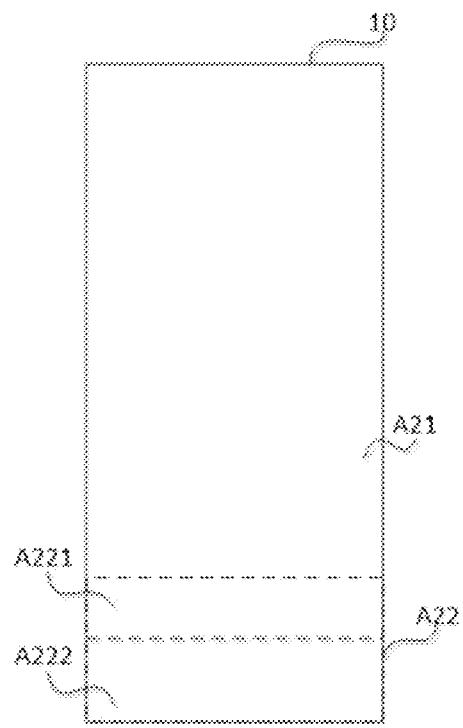
FIG. 2A is a schematic view of a region included in a second surface of a display substrate in a display panel according to at least one embodiment of the present disclosure.

As shown in FIG. 2A, the second surface of the display substrate 10 includes a first region A21 and a second region A22. The orthographic projection of the display region A1 onto the second surface overlaps the first region A21, and the orthographic projection of the peripheral region A2 onto the second surface overlaps the second region A22.

That the orthographic projection of the display region A1 onto the second surface overlaps the first region A21 may mean that the location of the orthographic projection of the display region A1 onto the second surface is the same as the location of the first region A21 on the second surface. For example, if the length of the first surface and the length of the second surface are both 15 cm, and the width of the first surface and the width of the second surface are both 5 cm, then the display region A1 is a region spanning 13.5 cm from right to left and 5 cm from top to bottom on the first surface, and the first region A21 is a region spanning 13.5 cm from right to left and 5 cm from top to bottom on the second surface.

That the orthographic projection of the peripheral region A2 onto the second surface overlaps the second region A22 means that the location of the orthographic projection of the peripheral region A2 onto the second surface is the same as the location of the second region A22 on the second surface. For example, if the length of the first surface and the length of the second surface are both 15 cm, and the width of the first surface and the width of the second surface are both 5 cm, then the peripheral region A2 is a region spanning 1.5 cm from left to right and 5 cm from top to bottom on the first surface, and the second region A22 is a region spanning 1.5 cm from left to right and 5 cm from top to bottom on the second surface.

When the display substrate 10 is a flexible display substrate, the second region A22 can include a bent region A221 and a non-bent region A222.

The bent region A221 is arranged between the non-bent region A222 and the first region A21.

When the display substrate 10 is a flexible display substrate, the driver integrated circuit (IC) and the multiplexing circuit are formed on the first surface of the display panel 10.

After layers such as a first back film layer, a second back film layer, a heat dissipation layer, a wave-absorbing material layer are arranged on the second surface of the display substrate 10, the display substrate 10 needs to be bent. The portion of the display substrate 10 corresponding to the bent region A221 is bent. The specific manner of bending is to be described below in conjunction with a particular embodiment.

In a specific implementation, the first surface of the display substrate includes a display region and a peripheral region at a periphery of the display region. The second surface includes a first region and a second region. The orthographic projection of the display region onto the second surface overlaps the first region, and the orthographic projection of the peripheral region onto the second surface overlaps the second region.

The wave-absorbing material layer may be arranged in the first region, and the multiplexing circuit may be arranged in the peripheral region.

In the display module according to at least one embodiment of the present disclosure, the wave-absorbing material layer may be located on the back surface of the display region of the display substrate (i.e., the wave-absorbing material layer may be arranged in the first region), and the multiplexing circuit is arranged in the peripheral region. When the display module according to at least one embodiment of the present disclosure is operating, electromagnetic wave interference signals are transmitted from the multiplexing circuit. The electromagnetic wave interference signals propagate along the display panel. The wave-absorbing material layer absorbs the electromagnetic wave interference signals and converts them into heat. The heat dissipation layer dissipates the heat.

In a specific implementation, the wave-absorbing material layer may include one or more of a ferrite layer, a magnetic ferrous nanomaterial layer, a carbon fiber layer, a carbon nanotube layer, or a silicon carbide layer.

In a specific implementation, the display panel according to at least one embodiment of the present disclosure further includes an upper antenna and a lower antenna and a plurality of data lines longitudinally arranged on the display substrate.

The upper antenna is arranged above the display substrate and the lower antenna is arranged below the display substrate. The data voltage signals provided by the multiplexing circuit are output through the data lines, and the wave-absorbing material layer is used to absorb the electromagnetic wave interference signals generated by the multiplexing circuit.

In at least one embodiment of the present disclosure, the upper antenna may be arranged above the display substrate and the lower antenna may be arranged below the display substrate. The antenna signal is transmitted by the lower antenna and received by the upper antenna, or the antenna signal is transmitted by the upper antenna and received by the lower antenna. The data voltage signals provided by the multiplexing circuit are transferred to the corresponding columns of pixel units through the longitudinally arranged data lines, and the electromagnetic wave interference signals generated by the multiplexing circuit are absorbed by the wave-absorbing material layer, so that the receiving antenna will not receive the electromagnetic wave interference signals, thereby preventing the impact of the electromagnetic wave interference signals on reception of communication signal by the antenna.

During practical operation, the upper antenna and the lower antenna may be arranged on a metal middle frame included in the display device. The upper antenna is arranged above the display substrate, and the lower antenna is arranged below the display substrate. The upper antenna is separated from the upper side edge of the display substrate by a distance, and the lower antenna is separated from the lower side edge of the display substrate by a distance.

Figure 2B:
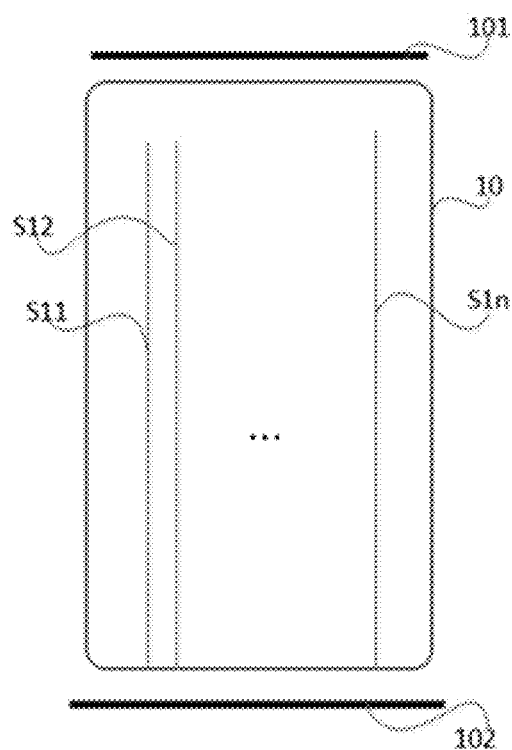
FIG. 2B is a schematic view showing the positional relationship of a display surface of a display panel with respect to an upper antenna 101 and a lower antenna 102 according to at least one embodiment of the present disclosure.

FIG. 2B is a schematic view showing the positional relationship of a display surface of a display panel with respect to an upper antenna 101 and a lower antenna 102 according to at least one embodiment of the present disclosure. The display panel includes a display substrate 10 and data lines arranged on the display surface of the display substrate 10. The display substrate 10 in FIG. 2B is a bent display substrate.

As shown in FIG. 2B, the upper antenna 101 is arranged above the display substrate 10 and the lower antenna 102 is arranged below the display substrate 10. The antenna signal is transmitted by the lower antenna 102 and received by the upper antenna 101, or the antenna signal is transmitted by the upper antenna 101 and received by the lower antenna 102. In FIG. 2B, the first data line is denoted as S11, the second data line is denoted as S12, and the n-th data line is denoted as S1n, where n is an integer greater than 2.

Figure 2C:
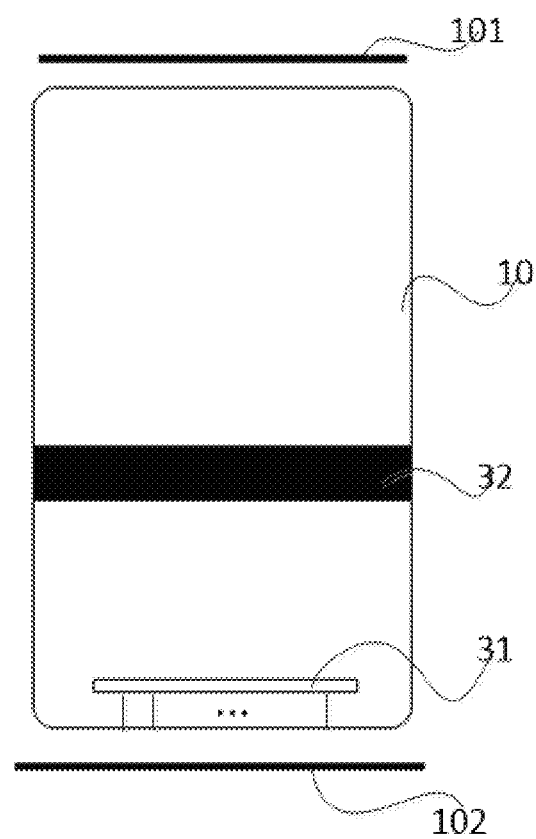
FIG. 2C is a schematic view showing the positional relationship of a non-display surface of a display panel with respect to an upper antenna 101 and a lower antenna 102 according to at least one embodiment of the present disclosure.

FIG. 2C is a schematic view showing the positional relationship of a non-display surface of a display panel with respect to an upper antenna 101 and a lower antenna 102 according to at least one embodiment of the present disclosure. The display panel includes a display substrate 10, and a wave-absorbing material layer 32 and a multiplexing circuit 31 arranged on the non-display surface of the display panel. The wave-absorbing material layer 32 is arranged on the second surface of the display substrate 10, and the multiplexing circuit 31 is arranged on the first surface of the display substrate 10. FIG. 2C shows a schematic view of the bent display substrate 10. Therefore, the wave-absorbing material layer 32 and the multiplexing circuit 31 are both arranged on the non-display surface.

In FIG. 2C, the lines connecting the multiplexing circuit 31 and the lower side edge of the display substrate 10 are portions of various data lines of FIG. 2B that are on the non-display surface of the display panel. The data voltage signals provided by the multiplexing circuit 31 are output through the longitudinally arranged data lines. The electromagnetic wave interference signals generated by the multiplexing circuit 31 are absorbed by the wave-absorbing material layer 32, so that the receiving antenna will not receive the electromagnetic wave interference signals, thereby preventing the impact of the electromagnetic wave interference signals on reception of communication signals by the antenna.

Figure 2D:
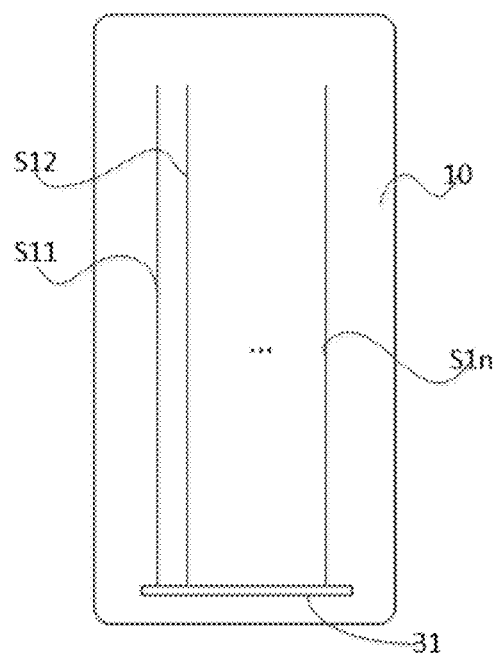
FIG. 2D is a schematic view showing the positional relationship of a first surface of a display substrate 10 as shown in FIG. 2B and a multiplexing circuit 31 arranged on the first surface with respect to various data lines before bending of the display substrate 10.

FIG. 2D is a schematic view showing the positional relationship of a first surface of a display substrate 10 as shown in FIG. 2B and a multiplexing circuit 31 arranged on the first surface with respect to various data lines before bending of the display substrate 10. As shown in FIG. 2D, the data voltage signals provided by the multiplexing circuit 31 are output through the longitudinally arranged data lines. In FIG. 2D, the first data line is denoted as S11, the second data line is denoted as S12, and the n-th data line is denoted as S1n, where n is an integer greater than 2.

Optionally, the display panel according to at least one embodiment of the present disclosure may further include a first back film layer. The first back film layer is arranged on part of the second surface. The first back film layer and the wave-absorbing material layer are arranged at the same level. The first back film layer is arranged in the first region.

In a specific implementation, that the first back film layer and the wave-absorbing material layer are arranged at the same level may mean that the first back film layer and the wave-absorbing material layer are at the same level spatially, and the upper surface of the first back film layer is flush with the upper surface of the second back film layer.

In a specific implementation, a first back film layer is arranged in the first region of the second surface of the display substrate. In at least one embodiment of the present disclosure, a partial region of the first back film layer may be replaced with a wave-absorbing material. That is, the first back film layer and the wave-absorbing material layer are arranged at the same level on the second surface of the display substrate. The wave-absorbing material layer absorbs the electromagnetic wave interference signals, to prevent impact of the electromagnetic wave interference signals on signal reception by the antenna.

Optionally, the first back film layer and the wave-absorbing material layer contact each other laterally.

Optionally, the thickness of the first back film layer may be the same as the thickness of the wave-absorbing material layer, or the thickness of the first back film layer may be different from the thickness of the wave-absorbing material layer.

Optionally, the first back film layer may be made of polyethylene terephthalate (PET) plastic.

Optionally, the display module according to at least one embodiment of the present disclosure may further include a heat dissipation layer. The heat dissipation layer is arranged on the side of the first back film layer that is far away from the display substrate.

The wave-absorbing material layer absorbs the electromagnetic wave interference signals and converts them into heat. The heat dissipation layer is used to dissipate the heat. In a specific implementation, the heat dissipation layer may include a first heat-dissipation film layer and a second heat-dissipation film layer. The first heat-dissipation film layer may include a mesh adhesive layer and a buffer layer. The second heat-dissipation film layer may include a graphite and copper foil layer.

The buffer layer may, for example, be made of a foam material.

In a specific implementation, the heat dissipation layer may be arranged in the first region.

Optionally, the first surface includes a display region and a peripheral region at a periphery of the display region, the second surface includes a first region and a second region; the orthographic projection of the display region onto the second surface overlaps the first region, and the orthographic projection of the peripheral region onto the second surface overlaps the second region; and the multiplexing circuit is arranged in the peripheral region.

The display panel further includes a first back film layer arranged in the first region of the second surface.

The wave-absorbing material layer may be arranged on the side of the first back film layer that is far away from the display panel.

In at least one embodiment of the present disclosure, the wave-absorbing material layer may be arranged on the side of the first back film layer that is far away from the display panel, to absorb the electromagnetic wave interference signals generated by the multiplexing circuit.

Optionally, the display panel according to at least one embodiment of the present disclosure may further include a first heat-dissipation film layer. The first heat-dissipation film layer and the wave-absorbing material layer are arranged at the same level. The orthographic projection of the first heat-dissipation film layer onto the second surface and the orthographic projection of the wave-absorbing material layer onto the second surface are both in the first region.

In a specific implementation, that the first heat-dissipation film layer and the wave-absorbing material layer are arranged at the same level may mean that the first heat-dissipation film layer and the wave-absorbing material layer are at the same level spatially, and the upper surface of the first heat-dissipation film layer is flush with the upper surface of the wave-absorbing material layer.

In a specific implementation, the display panel according to at least one embodiment of the present disclosure may further include a first heat-dissipation film layer arranged at the same level as the wave-absorbing material layer. That is, a partial region of the first heat-dissipation film layer arranged on the second surface of the display substrate is replaced with a wave-absorbing material, so as to absorb the electromagnetic wave interference signals generated by the multiplexing circuit.

Optionally, the thickness of the first heat-dissipation film layer may be the same as the thickness of the wave-absorbing material layer, or the thickness of the first heat-dissipation film layer may be different from the thickness of the wave-absorbing material layer.

Optionally, the first heat-dissipation film layer may include a mesh adhesive layer arranged on the side of the first back film layer that is far away from the display substrate and a foam material layer arranged on the side of the mesh adhesive layer that is far away from the first back film layer.

In a specific implementation, the display panel according to at least one embodiment of the present disclosure may further include a second heat-dissipation film layer. The second heat-dissipation film layer is arranged on the side of the first heat-dissipation film layer that is far away from the first back film layer. The orthographic projection of the second heat-dissipation film layer onto the second surface at least covers the orthographic projection of the first heat-dissipation film layer onto the second surface and the orthographic projection of the wave-absorbing material layer onto the second surface.

In at least one embodiment of the present disclosure, the display panel may further include a second heat-dissipation film layer. The second heat-dissipation film layer is arranged on the side of the first heat-dissipation film layer that is far away from the first back film layer.

Optionally, the second heat-dissipation film layer may, for example, be made of graphite and copper foil.

Optionally, the display panel according to at least one embodiment of the present disclosure may further include a first heat-dissipation film layer and a second heat-dissipation film layer. The first heat-dissipation film layer is arranged between the first back film layer and the wave-absorbing material layer. The second heat-dissipation film layer and the wave-absorbing material layer are arranged at the same level. The orthographic projection of the first heat-dissipation film layer onto the second surface at least covers the orthographic projection of the second heat-dissipation film layer onto the second surface and the orthographic projection of the wave-absorbing material layer onto the second surface.

In a specific implementation, that the second heat-dissipation film layer and the wave-absorbing material layer are arranged at the same level may mean that the second heat-dissipation film layer and the wave-absorbing material layer are at the same level spatially, and the upper surface of the second heat-dissipation film layer is flush with the upper surface of the wave-absorbing material layer.

In a specific implementation, the display panel according to at least one embodiment of the present disclosure may further include a first heat-dissipation film layer and a second heat-dissipation film layer. A partial region of the second heat-dissipation film layer may be replaced with a wave-absorbing material. That is, the second heat-dissipation film layer and the wave-absorbing material layer are arranged at the same level. The wave-absorbing material layer absorbs the electromagnetic wave interference signals and converts them into heat. The first heat-dissipation film layer and the second heat-dissipation film layer dissipate the heat.

Optionally, the thickness of the second heat-dissipation film layer may be the same as the thickness of the wave-absorbing material layer, or the thickness of the second heat-dissipation film layer may be different from the thickness of the wave-absorbing material layer.

In at least one embodiment of the present disclosure, when the wave-absorbing material layer is arranged in the first region, a second back film layer is arranged in the second region of the second surface of the display substrate. The second back film layer may be made of PET plastic, and the thickness of the second back film layer may be substantially equal to the thickness of the first back film layer.

That the thickness of the second back film layer is substantially equal to the thickness of the first back film layer may mean that the ratio of the thickness of the second back film layer to the thickness of the first back film layer is greater than or equal to 95% and less than or equal to 105%.

Optionally, the display substrate may be a flexible display substrate. The first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region. The multiplexing circuit is arranged in the peripheral region. The second region includes a bent region and a non-bent region. The bent region is arranged between the non-bent region and the first region. The wave-absorbing material layer is arranged in the non-bent region.

In a specific implementation, the wave-absorbing material layer may be arranged on the back surface of the multiplexing circuit. That is, the second back film layer arranged in the non-bent region is replaced with the wave-absorbing material layer. During manufacture of the display panel according to at least one embodiment of the present disclosure, after a driver IC, a multiplexing circuit, a wave-absorbing material layer, a first back film layer, and a heat dissipation layer are arranged on the display substrate, the wave-absorbing material layer, the display panel, the multiplexing circuit, and the driver IC arranged in the non-bent region need to be folded back and pressed close to the heat dissipation layer, so that the heat derived from the conversion by the wave-absorbing material layer is dissipated through the heat dissipation layer.

Optionally, when the wave-absorbing material layer is arranged in the non-bent region, the thickness of the wave-absorbing material layer may be the same as the thickness of the first back film layer, or the thickness of the wave-absorbing material layer may be different from the thickness of the first back film layer.

The display module according to at least one embodiment of the present disclosure includes a multiplexing circuit and the display panel described above. The multiplexing circuit is arranged on the first surface of the display substrate included in the display panel.

Optionally, the display module according to at least one embodiment of the present disclosure includes a driver integrated circuit. The driver integrated circuit is arranged on the side of the multiplexing circuit that is far away from the display substrate.

Optionally, the display module according to at least one embodiment of the present disclosure may further include a bottom adhesive tape layer, a polarizer layer, a top adhesive tape layer, and a cover plate. The bottom adhesive tape layer, the polarizer layer, the top adhesive tape layer, and the cover plate are arranged sequentially on the side of the display substrate that is far away from the first back film layer.

In at least one embodiment of the present disclosure, the cover plate may be a glass cover plate.

Figure 3A:
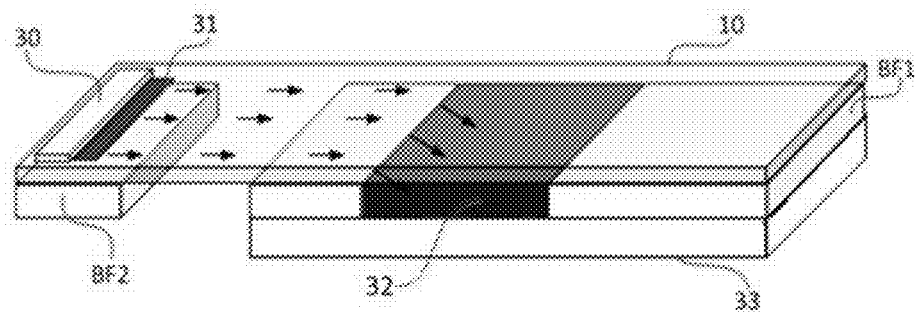
FIG. 3A is a schematic structural view of a display module according to at least one embodiment of the present disclosure.

As shown in FIG. 3A, the display module according to at least one embodiment of the present disclosure includes a display substrate 10, a multiplexing circuit 31, a driver integrated circuit 30, a first back film layer BF1, a wave-absorbing material layer 32, a heat dissipation layer 33, and a second back film layer BF2.

The display substrate 10 includes a first surface and a second surface opposite to each other.

The first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region.

The wave-absorbing material layer 32 and the first back film layer BF1 are both arranged on the second surface, and the first back film layer BF1 and the wave-absorbing material layer 32 are arranged at the same level.

The first back film layer BF1 and the wave-absorbing material layer 32 are both arranged in the first region.

The heat dissipation layer 33 is provided on the side of the first back film layer BF1 that is far away from the display substrate 10.

The multiplexing circuit 31 and the driver integrated circuit 30 are arranged in the peripheral region, and the second back film layer BF2 is arranged in the second region. That the first back film layer BF1 and the wave-absorbing material layer 32 are arranged at the same level may mean that the first back film layer BF1 and the wave-absorbing material layer 32 are arranged at the same level spatially, and the upper surface of the first back film layer BF1 is flush with the upper surface of the wave-absorbing material layer 32.

In the display module according to at least one embodiment of the present disclosure as shown in FIG. 3A, the first back film layer BF1 and the wave-absorbing material layer 32 contact each other laterally, so as to support the display substrate 10. As the display substrate 10 has a small thickness, it needs to be supported from below by the first back film layer BF1 and the wave-absorbing material layer 32 in close contact.

In the display module according to at least one embodiment of the present disclosure as shown in FIG. 3A, the thickness of the wave-absorbing material layer 32 may be the same as the thickness of the first back film layer BF1, the first back film layer BF1 and the second back film layer BF2 may be protective film layers made of PET plastic, and the heat dissipation layer may include a mesh adhesive layer, a buffer layer, and a graphite and copper foil layer arranged sequentially (where the mesh adhesive layer is arranged on the side of the first back film layer BF1 that is far away from the display substrate 10).

That the thickness of the wave-absorbing material layer 32 is substantially the same as the thickness of the first back film layer BF1 may mean that the ratio of the thickness of the wave-absorbing material layer 32 to the thickness of the first back film layer BF1 may be greater than or equal to 95% and less than or equal to 105%.

In the display module according to at least one embodiment of the present disclosure as shown in FIG. 3A, the thickness of the heat dissipation layer 33 is greater than the thickness of the first back film layer BF1, and the thickness of the first back film layer BF1 is greater than the thickness of the display substrate 10.

Optionally, the buffer layer may, for example, be made of a foam material.

Optionally, the thickness of the first back film layer BF1 may be greater than or equal to 0.05 mm and less than or equal to 0.1 mm. The thickness of the wave-absorbing material layer 32 may be greater than or equal to 0.03 mm and less than or equal to 0.15 mm. The thickness of the display substrate 10 may be greater than or equal to 0.02 mm and less than or equal to 0.05 mm. The thickness of the heat dissipation layer 33 may be greater than or equal to 0.11 mm and less than or equal to 0.2 mm.

In the display module according to at least one embodiment of the present disclosure as shown in FIG. 3A, a partial region of the first back film layer BF1 on the second surface of the display substrate 10 is replaced with a wave-absorbing material. That is, the wave-absorbing material layer 32 and the first back film layer BF1 are arranged at the same level spatially. The wave-absorbing material layer 32 absorbs the electromagnetic wave interference signals generated by the multiplexing circuit 21 and converts the electromagnetic wave interference signals into heat. The heat dissipation layer 33 dissipates the heat.

Figure 3B:
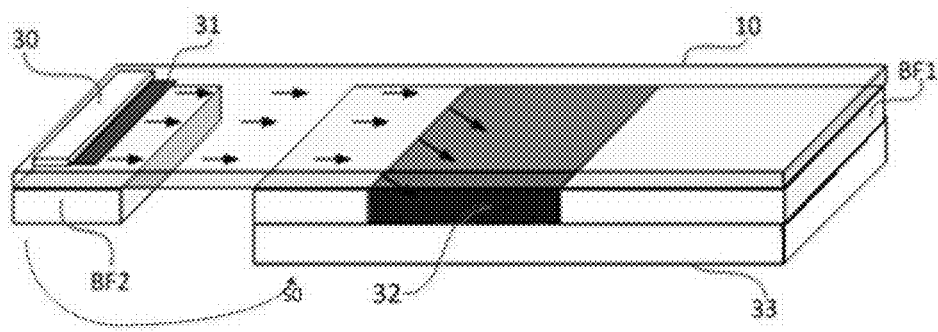
FIG. 3B is a schematic view showing the bending direction of the display module according to at least one embodiment of the present disclosure as shown in FIG. 3A.

As shown in FIG. 3A, when the display substrate 10 is a flexible display substrate, the second region includes a non-bent region and a bent region. The second back film layer BF2 may be arranged in the non-bent region. During manufacture of the display module according to at least one embodiment of the present disclosure, after a multiplexing circuit 31, a driver integrated circuit 30, a first back film layer BF1, a wave-absorbing material layer 32, a heat dissipation layer 33, and a second back film layer BF2 are formed on the display substrate 10, the display substrate 10 needs to be bent. As shown in FIG. 3B, the portion of the display substrate 10 corresponding to the bent region is bent along the fold-back direction S0. A cross-sectional view of the display module according to at least one embodiment of the present disclosure after the bending is as shown in FIG. 4.

Figure 4:
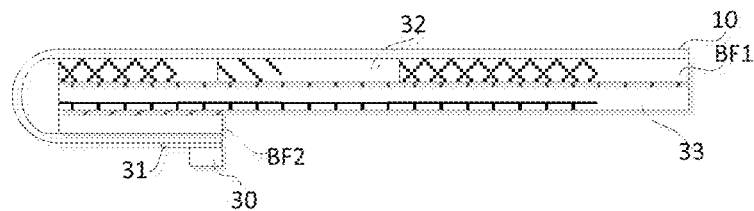
FIG. 4 is a cross-sectional view of the display module according to at least one embodiment of the present disclosure as shown in FIG. 3A.

As shown in FIG. 4, after the portion of the display substrate 10 corresponding to the bent region is bent along the fold-back direction S0, the orthographic projection of the driver integrated circuit 30 onto the display substrate 10 adjoins the orthographic projection of the wave-absorbing material layer 32 onto the display substrate 10. However, during practical operation, the orthographic projection of the driver integrated circuit 30 onto the display substrate 10 may be spaced apart from the orthographic projection of the wave-absorbing material layer 32 onto the display substrate 10.

Figure 5:
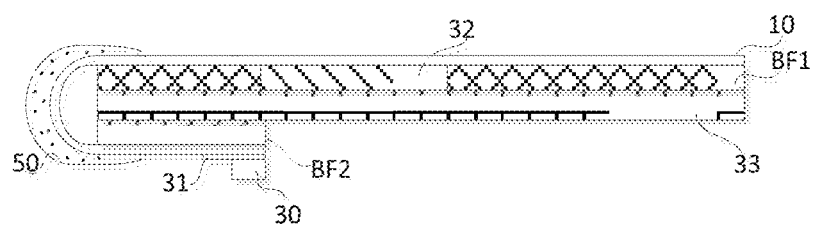
FIG. 5 is a cross-sectional view of the display module according to at least one embodiment of the present disclosure as shown in FIG. 4 after an MCL adhesive layer is added to the display module.

During practical operation, as shown in FIG. 5, after the display substrate 10 is bent, a micro coating layer (MCL)

adhesive layer 50 needs to be provided at the bending position. The MCL adhesive layer 50 serves to protect the bent region.

Optionally, the thickness of the MCL adhesive layer 50 may be 0.09 millimeter (mm).

In the display module according to at least one embodiment of the present disclosure as shown in FIG. 3A and FIG. 4, the thickness of the wave-absorbing material layer may be 0.1 mm, the thickness of the first back film layer BF1 and the thickness of the second back film layer BF2 may be 0.1 mm, and the thickness of the display substrate 10 may be 0.03 mm.

In a specific implementation, the thickness of the first back film layer BF1 and the thickness of the second back film layer BF2 may be greater than or equal to 0.05 mm and less than or equal to 0.1 mm, the thickness of the display substrate 10 may be greater than or equal to 0.02 mm and less than or equal to 0.05 mm, the thickness of the wave-absorbing material layer 32 may be greater than or equal to 0.03 mm and less than or equal to 0.15 mm, and the thickness of the wave-absorbing material layer 32 may be greater than or equal to 0.03 mm and less than or equal to 0.15 mm.

Figure 6:
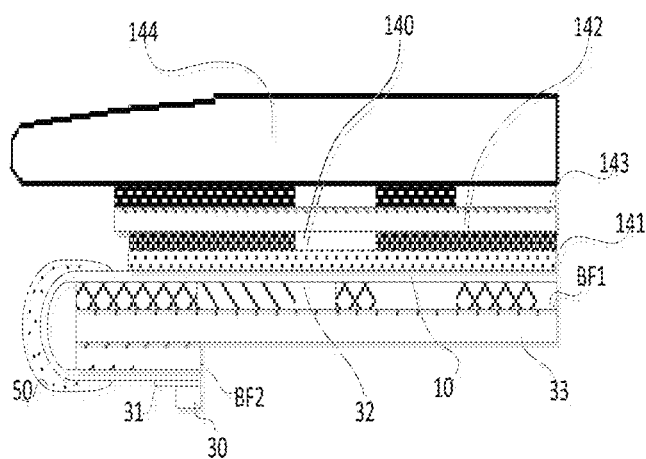
FIG. 6 is cross-sectional view of a display module according to at least one embodiment of the present disclosure.

As shown in FIG. 6, after the display substrate 10 is bent, a bottom adhesive tape layer 141, a touch substrate 140, a polarizer layer 142, a top adhesive tape layer 143, and a glass cover plate 144 may be arranged sequentially on a side of the display substrate 10 that is far away the first back film layer BF1.

In a specific implementation, the bottom adhesive tape layer 141 and the top adhesive tape layer 143 may be made of optical adhesive.

Figure 7:
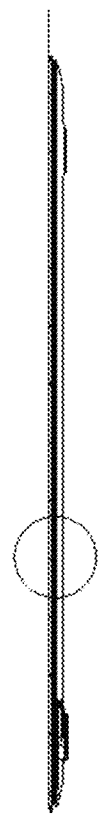
FIG. 7 is a diagram of a product stack corresponding to the display module according to at least one embodiment of the present disclosure as shown in FIG. 6.

FIG. 7 is a diagram of a product stack corresponding to the display module according to at least one embodiment of the present disclosure.

Figure 8:
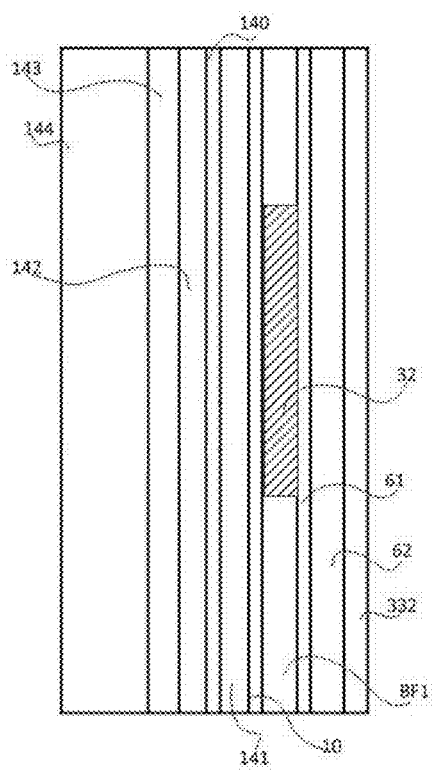
FIG. 8 is an enlarged sectional view of a portion within the circle in FIG. 7.

FIG. 8 is an enlarged sectional view of a portion within the circle in FIG. 7. As shown in FIG. 8, the wave-absorbing material layer is denoted by 32, the first back film layer is denoted by BF1, the mesh adhesive layer is denoted by 61, the buffer layer is denoted by 62, the second heat-dissipation film layer is denoted by 332, the display substrate is denoted by 10, the bottom adhesive tape layer is denoted by 141, the polarizer layer is denoted by 142, the top adhesive tape layer is denoted by 143, the glass cover plate is denoted by 144, and the touch substrate is denoted by 140. The heat dissipation layer includes the mesh adhesive layer 61, the buffer layer 62, and the second heat-dissipation film layer 332.

Figure 9A:
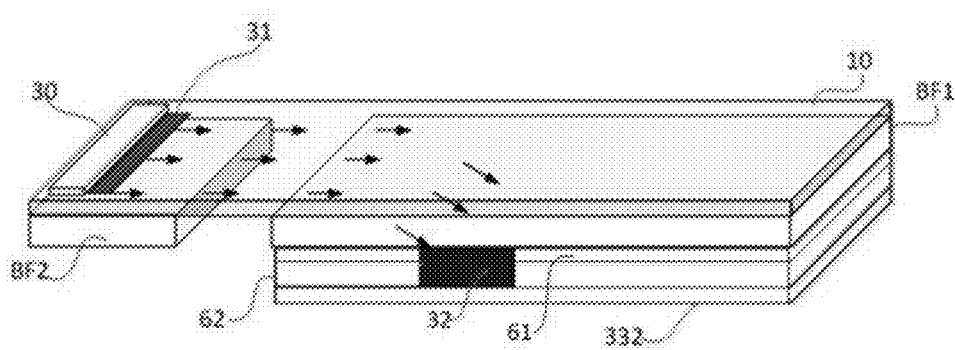
FIG. 9A is a schematic structural view of a display module according to at least one embodiment of the present disclosure.

As shown in FIG. 9A, the display module according to at least one embodiment of the present disclosure includes a display substrate 10, a multiplexing circuit 31, a driver integrated circuit 30, a first back film layer BF1, a wave-absorbing material layer 32, a heat dissipation layer, and a second back film layer BF2.

The display substrate 10 includes a first surface and a second surface opposite to each other.

The first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region.

The first back film layer BF1 is arranged in the first region of the second surface.

The wave-absorbing material layer 32 is arranged on the side of the first back film layer BF1 that is far away from the display substrate 10.

The heat dissipation layer includes a first heat-dissipation film layer and a second heat-dissipation film layer 332.

The first heat-dissipation film layer includes a mesh adhesive layer 61 and a buffer layer 62.

The wave-absorbing material layer 32 and the first heat-dissipation film layer are arranged at the same level, and the orthographic projection of the first heat-dissipation film layer onto the second surface and the orthographic projection of the wave-absorbing material layer 32 onto the second surface are both in the first region.

The second heat-dissipation film layer 332 is arranged on the side of the first mesh adhesive layer 61 that is far away the first back film layer BF1. The orthographic projection of the second heat-dissipation film layer 332 onto the second surface at least covers the orthographic projection of the first heat-dissipation film layer onto the second surface and the orthographic projection of the wave-absorbing material layer 32 onto the second surface.

The multiplexing circuit 31 and the driver integrated circuit 30 are arranged in the peripheral region, and the second back film layer BF2 is arranged in the second region.

That the wave-absorbing material layer 32 and the first heat-dissipation film layer are arranged at the same level may mean that the wave-absorbing material layer 32 and the first heat-dissipation film layer are at the same level spatially, and the upper surface of the wave-absorbing material layer 32 is flush with the upper surface of the first heat-dissipation film layer.

In the display module according to at least one embodiment of the present disclosure as shown in FIG. 9A, the buffer layer 62 may, for example, be made of a foam material, and the second heat-dissipation film layer 332 may be a graphite and copper foil layer.

In the display module according to at least one embodiment of the present disclosure as shown in FIG. 9A, the thickness of the first heat-dissipation film layer may be substantially the same as the thickness of the wave-absorbing material layer 32, and the first back film layer BF1 and the second back film layer BF2 may be a protective film layer made of PET plastic.

That the thickness of the first heat-dissipation film layer may be substantially the same as the thickness of the wave-absorbing material layer 32 may mean that the ratio of the thickness of the first heat-dissipation film layer to the thickness of the wave-absorbing material layer 32 is greater than or equal to 95% and less than or equal to 105%.

In the display module according to at least one embodiment of the present disclosure as shown in FIG. 9A, the wave-absorbing material layer 32 and the heat-dissipation film layer may contact each other laterally, or the wave-absorbing material layer 32 may be spaced apart from the heat-dissipation film layer.

In the display module according to at least one embodiment of the present disclosure as shown in FIG. 9A, the thickness of the first heat-dissipation film layer may be substantially equal to the thickness of the first back film layer BF1, the thickness of the first heat-dissipation film layer may be greater than the thickness of the second heat-dissipation film layer 332, and the thickness of the second heat-dissipation film layer 332 may be greater than the thickness of the display substrate 10.

That the thickness of the first heat-dissipation film layer may be substantially equal to the thickness of the first back film layer BF1 may mean that the ratio of the thickness of the first heat-dissipation film layer to the thickness of the first back film layer BF1 is greater than or equal to 95% and less than or equal to 105%.

In the display module according to at least one embodiment of the present disclosure as shown in FIG. 9A, a partial region of the first heat-dissipation film layer on the second surface of the display substrate 10 is replaced with a wave-absorbing material. That is, the wave-absorbing material layer 32 and the first heat-dissipation film layer are arranged at the same level. The wave-absorbing material layer 32 absorbs the electromagnetic wave interference signals generated by the multiplexing circuit 31 and converts the electromagnetic wave interference signals into heat. The first heat-dissipation film layer and the second heat-dissipation film layer 332 dissipate the heat.

Figure 9B:
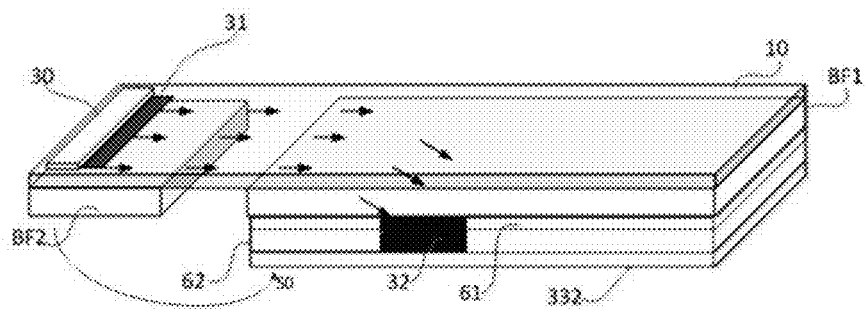
FIG. 9B is a schematic view showing the bending direction of the display module according to at least one embodiment of the present disclosure as shown in FIG. 9A.

As shown in FIG. 9A, when the display substrate 10 is a flexible display substrate, the second region includes a non-bent region and a bent region. The second back film layer BF2 may be arranged in the non-bent region. During manufacture of the display module according to at least one embodiment of the present disclosure, after a multiplexing circuit 31, a driver integrated circuit 30, a first back film layer BF1, a wave-absorbing material layer 32, a first heat-dissipation film layer, a second heat-dissipation film layer 332, and a second back film layer BF2 are formed on the display substrate 10, the display substrate 10 needs to be bent. As shown in FIG. 9B, the portion of the display substrate 10 corresponding to the bent region is bent along the fold-back direction S0. A cross-sectional view of the display module according to at least one embodiment of the present disclosure after the bending is as shown in FIG. 10.

Figure 10:
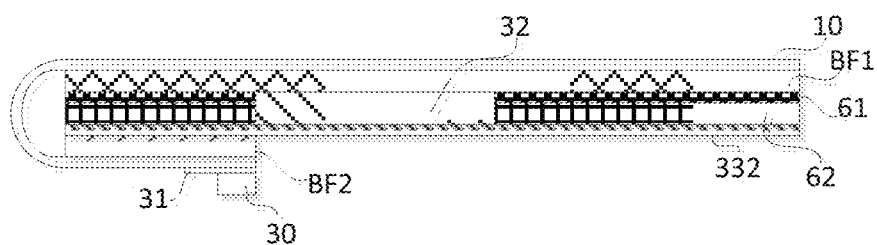
FIG. 10 is a cross-sectional view of the display module according to at least one embodiment of the present disclosure as shown in FIG. 9A.

As shown in FIG. 10, after the portion of the display substrate 10 corresponding to the bent region is bent along the fold-back direction S0, the orthographic projection of the driver integrated circuit 30 onto the display substrate 10 adjoins the orthographic projection of the wave-absorbing material layer 32 onto the display substrate 10. However, during practical operation, the orthographic projection of the driver integrated circuit 30 onto the display substrate 10 may be spaced apart from the orthographic projection of the wave-absorbing material layer 32 onto the display substrate 10.

Figure 11:
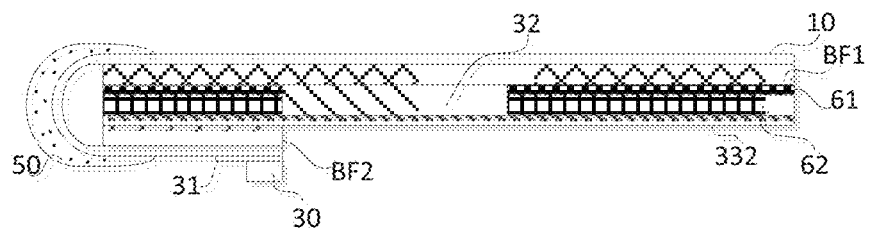
FIG. 11 is a cross-sectional view of the display module according to at least one embodiment of the present disclosure as shown in FIG. 10 after an MCL adhesive layer is added to the display module.

During practical operation, as shown in FIG. 11, after the display substrate 10 is bent, a micro coating layer (MCL) adhesive layer 50 needs to be provided at the bending position. The MCL adhesive layer 50 serves to protect the bent region.

Optionally, the thickness of the MCL adhesive layer may be 0.09 millimeter (mm).

In the display module according to at least one embodiment of the present disclosure as shown in FIG. 9A and FIG. 10, the thickness of the wave-absorbing material layer may be 0.1 mm, the thickness of the first back film layer BF1 and the thickness of the second back film layer BF2 may be 0.1 mm, the thickness of the display substrate 10 may be 0.03 mm, the thickness of the first heat-dissipation film layer may be 0.1 mm, and the thickness of the second heat-dissipation film layer 332 may be 0.05 mm.

In a specific implementation, the thickness of the first back film layer BF1 and the thickness of the second back film layer BF2 may be greater than or equal to 0.05 mm and less than or equal to 0.1 mm, the thickness of the display substrate 10 may be greater than or equal to 0.02 mm and less than or equal to 0.05 mm, the thickness of the first heat-dissipation film layer 331 may be greater than or equal to 0.08 mm and less than or equal to 0.15 mm, the thickness of the second heat-dissipation film layer 332 may be greater than or equal to 0.03 mm and less than or equal to 0.05 mm, and the thickness of the wave-absorbing material layer 32 may be greater than or equal to 0.03 mm and less than or equal to 0.15 mm.

Figure 12A:
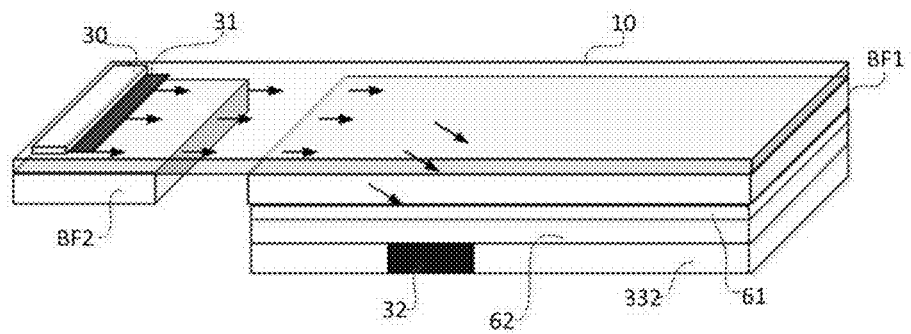
FIG. 12A is a schematic structural view of a display module according to at least one embodiment of the present disclosure.

As shown in FIG. 12A, the display module according to at least one embodiment of the present disclosure includes a display substrate 10, a multiplexing circuit 31, a driver integrated circuit 30, a first back film layer BF1, a wave-absorbing material layer 32, a heat dissipation layer, and a second back film layer BF2. The display substrate 10 includes a first surface and a second surface opposite to each other.

The first surface includes a display region and a peripheral region at a periphery of the display region. The second surface includes a first region and a second region. The orthographic projection of the display region onto the second surface overlaps the first region and the orthographic projection of the peripheral region onto the second surface overlaps the second region.

The first back film layer BF1 is arranged in the first region of the second surface.

The heat dissipation layer includes a first heat-dissipation film layer and a second heat-dissipation film layer 332.

The first heat-dissipation film layer includes a mesh adhesive layer 61 and a buffer layer 62.

The mesh adhesive layer 61 is arranged on the side of the first back film layer BF1 that is far away from the display substrate 10.

The buffer layer 62 is arranged on the side of the mesh adhesive layer 61 that is far away from the first back film layer BF1.

The wave-absorbing material layer 32 is arranged on the side of the buffer layer 62 that is far away from the mesh adhesive layer 61.

The second heat-dissipation film layer 332 and the wave-absorbing material layer 32 are arranged at the same level spatially.

The multiplexing circuit 31 and the driver integrated circuit 30 are arranged in the peripheral region, and the second back film layer BF2 is arranged in the second region.

That the second heat-dissipation film layer 332 and the wave-absorbing material layer 32 are arranged at the same level spatially may mean that the upper surface of the second heat-dissipation film layer 332 is flush with the upper surface of the wave-absorbing material layer 32.

In the display module according to at least one embodiment of the present disclosure as shown in FIG. 12A, the second heat-dissipation film layer 332 and the wave-absorbing material layer 32 may contact each other laterally, or the second heat-dissipation film layer 332 may be spaced apart from the wave-absorbing material layer 32.

In the display module according to at least one embodiment of the present disclosure as shown in FIG. 12A, the buffer layer 62 may, for example, be made of a foam material, and the second heat-dissipation film layer 332 may be a graphite and copper foil layer.

In the display module according to at least one embodiment of the present disclosure as shown in FIG. 12A, the thickness of the wave-absorbing material layer 32 may be substantially the same as the thickness of the second heat-dissipation film layer 332. The first back film layer BF1 and the second back film layer BF2 may be protective film layers made of PET plastic.

That the thickness of the wave-absorbing material layer 32 is substantially the same as the thickness of the second heat-dissipation film layer 332 may mean that the ratio of the thickness of the wave-absorbing material layer 32 to the thickness of the second heat-dissipation film layer 332 is greater than or equal to 95% and less than or equal to 105%.

In the display module according to at least one embodiment of the present disclosure as shown in FIG. 12A, the thickness of the first heat-dissipation film layer is substantially equal to the thickness of the first back film layer BF1, the thickness of the first heat-dissipation film layer is greater than the thickness of the second heat-dissipation film layer 332, and the thickness of the second heat-dissipation film layer 332 is greater than the thickness of the display substrate 10.

That the thickness of the first heat-dissipation film layer is substantially equal to the thickness of the first back film layer BF1 may mean that the ratio of the thickness of the first heat-dissipation film layer to the thickness of the first back film layer BF1 is greater than or equal to 95% and less than or equal to 105%. In the display module according to at least one embodiment of the present disclosure as shown in FIG. 12A, a partial region of the second heat-dissipation film layer 332 on the second surface of the display substrate 10 is replaced with a wave-absorbing material. That is, the wave-absorbing material layer 32 and the second heat-dissipation film layer 332 are arranged at the same level spatially. The wave-absorbing material layer 32 absorbs the electromagnetic wave interference signals generated by the multiplexing circuit 31 and converts the electromagnetic wave interference signals into heat. The first heat-dissipation film layer and the second heat-dissipation film layer 332 dissipate the heat.

Figure 12B:
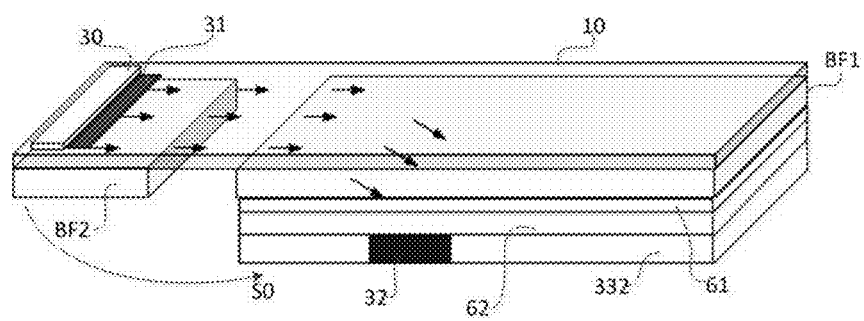
FIG. 12B is a schematic view showing the bending direction of the display module according to at least one embodiment of the present disclosure as shown in FIG. 12A.

As shown in FIG. 12A, when the display substrate 10 is a flexible display substrate, the second region includes a non-bent region and a bent region. The second back film layer BF2 may be arranged in the non-bent region. During manufacture of the display module according to at least one embodiment of the present disclosure, after the multiplexing circuit 31, the driver integrated circuit 30, the first back film layer BF1, the wave-absorbing material layer 32, the first heat-dissipation film layer, the second heat-dissipation film layer 332, and the second back film layer BF2 are formed on the display substrate 10, the display substrate 10 needs to be bent. As shown in FIG. 12B, the portion of the display substrate 10 corresponding to the bent region is bent along the fold-back direction S0. A cross-sectional view of the display module according to at least one embodiment of the present disclosure after the bending is as shown in FIG. 13.

Figure 13:
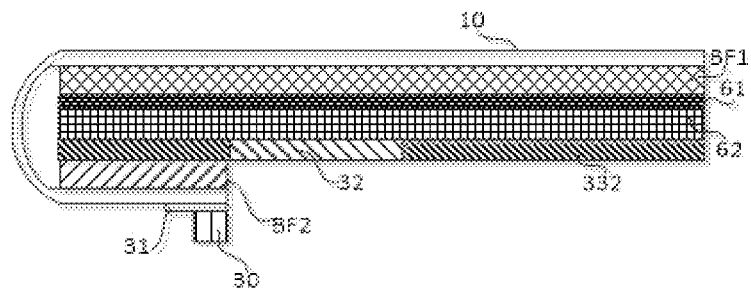
FIG. 13 is a cross-sectional view of the display module according to at least one embodiment of the present disclosure as shown in FIG. 12A.

As shown in FIG. 13, after the portion of the display substrate 10 corresponding to the bent region is bent along the fold-back direction S0, the orthographic projection of the driver integrated circuit 30 onto the display substrate 10 adjoins the orthographic projection of the wave-absorbing material layer 32 onto the display substrate 10. However, during practical operation, the orthographic projection of the driver integrated circuit 30 onto the display substrate 10 may be spaced apart from the orthographic projection of the wave-absorbing material layer 32 onto the display substrate 10. As shown in FIG. 13, after the portion of the display substrate 10 corresponding to the bent region is bent along the fold-back direction S0, the orthographic projection of the multiplexing circuit 31 onto the display substrate 10 adjoins the orthographic projection of the wave-absorbing material layer 32 onto the display substrate 10. However, during practical operation, the orthographic projection of the multiplexing circuit 31 onto the display substrate 10 may be spaced apart from the orthographic projection of the wave-absorbing material layer 32 onto the display substrate 10.

Figure 14:
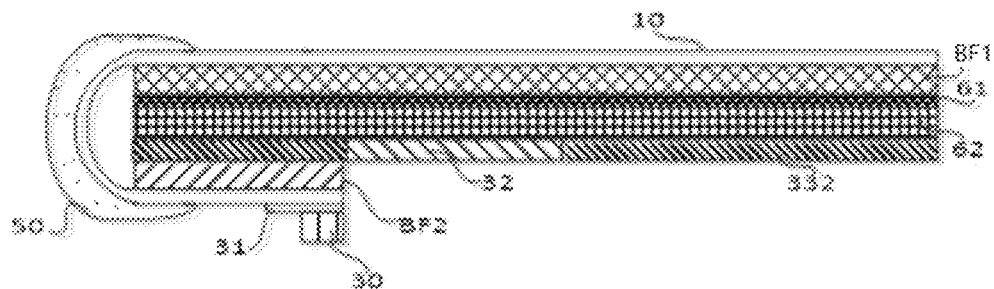
FIG. 14 is a cross-sectional view of the display module according to at least one embodiment of the present disclosure as shown in FIG. 13 after an MCL adhesive layer is added to the display module.

During practical operation, as shown in FIG. 14, after the display substrate 10 is bent, a micro coating layer (MCL) adhesive layer 50 needs to be provided at the bending position. The MCL adhesive layer 50 serves to protect the bent region.

Optionally, the thickness of the MCL adhesive layer 50 may be 0.09 millimeter (mm).

In the display module according to at least one embodiment of the present disclosure as shown in FIG. 12A and FIG. 13, the thickness of the wave-absorbing material layer 32 may be 0.05 mm, the thickness of the first back film layer BF1 and the thickness of the second back film layer BF2 may be 0.1 mm, the thickness of the display substrate 10 may be 0.03 mm, the thickness of the first heat-dissipation film layer may be 0.1 mm, and the thickness of the second heat-dissipation film layer 332 may be 0.05 mm.

In a specific implementation, the thickness of the first back film layer BF1 and the thickness of the second back film layer BF2 may be greater than or equal to 0.05 mm and less than or equal to 0.1 mm, the thickness of the display substrate 10 may be greater than or equal to 0.02 mm and less than or equal to 0.05 mm, the thickness of the first heat-dissipation film layer 331 may be greater than or equal to 0.08 mm and less than or equal to 0.15 mm, the thickness of the second heat-dissipation film layer 332 may be greater than or equal to 0.03 mm and less than or equal to 0.05 mm, and the thickness of the wave-absorbing material layer 32 may be greater than or equal to 0.03 mm and less than or equal to 0.15 mm.

Figure 15:
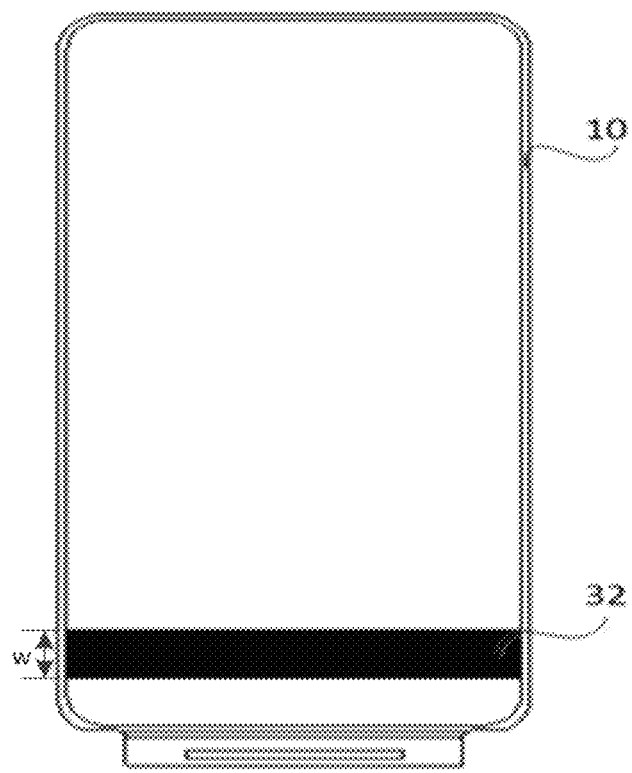
FIG. 15 is a schematic view showing the position of a wave-absorbing material layer 32 relative to the display substrate 10 in the display module according to at least one embodiment of the present disclosure.

FIG. 15 is a schematic view showing the position of the wave-absorbing material layer 32 relative to the display substrate 10 in the display module according to at least one embodiment of the present disclosure as shown in FIG. 3A; FIG. 15 is a schematic view showing the position of the wave-absorbing material layer 32 relative to the display substrate 10 in the display module according to at least one embodiment of the present disclosure as shown in FIG. 9A; and FIG. 15 is a schematic view showing the position of the wave-absorbing material layer 32 relative to the display substrate 10 in the display module according to at least one embodiment of the present disclosure as shown in FIG. 12A.

As shown in FIG. 15, the wave-absorbing material layer 32 is arranged in the first region on the second surface of the display substrate 10. Pixel units may be arranged in the orthographic projection of the wave-absorbing material layer 32 onto the first surface of the display substrate 10. The orthographic projection is arranged in the display region on the first surface.

As shown in FIG. 15, the width w of the orthographic projection of the wave-absorbing material layer 32 onto the display substrate 10 may be greater than or equal to 8 millimeter (mm) and less than or equal to 15 mm.

As shown in FIG. 15, the width w of the orthographic projection of the wave-absorbing material layer 32 onto the display substrate 10 may be the distance difference between a first distance between the upper side edge of the orthographic projection and the lower side edge of the display substrate 10 and a second distance between the lower side edge of the orthographic projection and the lower side edge of the display substrate 10.

Figure 16A:
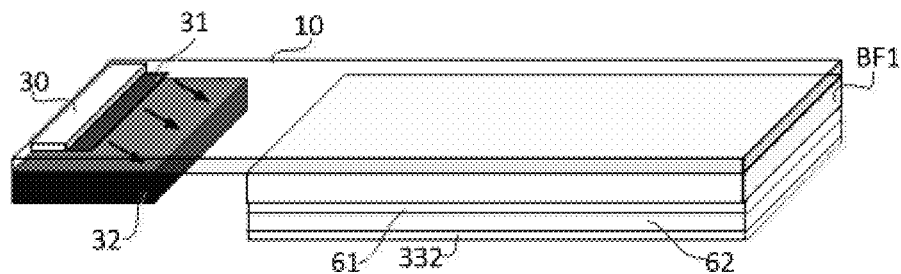
FIG. 16A is a schematic structural view of a display module according to at least one embodiment of the present disclosure.

As shown in FIG. 16A, the display module according to at least one embodiment of the present disclosure includes a display substrate 10, a multiplexing circuit 31, a driver integrated circuit 30, a first back film layer BF1, a wave-absorbing material layer 32, and a heat dissipation layer. The display substrate 10 includes a first surface and a second surface opposite to each other.

The first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region.

The multiplexing circuit 31 and the driver integrated circuit 30 are arranged in the peripheral region.

The second region includes a bent region and a non-bent region.

The bent region is arranged between the non-bent region and the first region.

The wave-absorbing material layer 32 is arranged in the non-bent region.

The heat dissipation layer includes a mesh adhesive layer 61, a buffer layer 62, and a second heat-dissipation film layer 332 that are arranged sequentially.

In the display module according to at least one embodiment of the present disclosure as shown in FIG. 16A, the buffer layer 62 may, for example, be made of a foam material. The second heat-dissipation film layer 332 may be a graphite and copper foil layer.

In the display module according to at least one embodiment of the present disclosure as shown in FIG. 16A, the second back film layer arranged in the non-bent region is replaced with the wave-absorbing material layer 32, and the thickness of the wave-absorbing material layer 32 may be substantially equal to the thickness of the first back film layer BF1.

In the display module according to at least one embodiment of the present disclosure as shown in FIG. 16A, the thickness of the first back film layer BF1 is 0.1 mm, the thickness of the display substrate 10 is 0.03 mm, and the thickness of the wave-absorbing material layer 32 may be 0.1 mm.

That the thickness of the wave-absorbing material layer 32 may be substantially equal to the thickness of the first back film layer BF1 may mean that the ratio of the thickness of the wave-absorbing material layer 32 to the thickness of the first back film layer BF1 is greater than or equal to 95% and less than or equal to 105%.

In a specific implementation, the thickness of the first back film layer BF1 and the thickness of the second back film layer BF2 may be greater than or equal to 0.05 mm and less than or equal to 0.1 mm, the thickness of the display substrate 10 may be greater than or equal to 0.02 mm and less than or equal to 0.05 mm, the thickness of the first heat-dissipation film layer 331 may be greater than or equal to 0.08 mm and less than or equal to 0.15 mm, the thickness of the second heat-dissipation film layer 332 may be greater than or equal to 0.03 mm and less than or equal to 0.05 mm, and the thickness of the wave-absorbing material layer 32 may be greater than or equal to 0.03 mm and less than or equal to 0.15 mm.

Figure 16B:
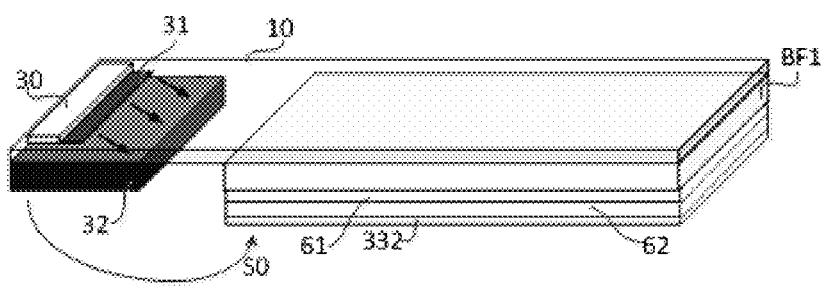
FIG. 16B is a schematic view showing the bending direction of the display module according to at least one embodiment of the present disclosure as shown in FIG. 16A.
Figure 17:
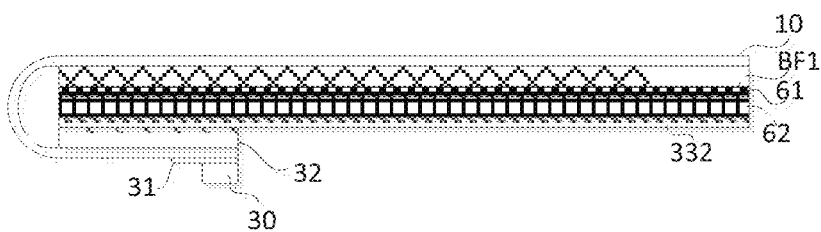
FIG. 17 is a cross-sectional view of the display module according to at least one embodiment of the present disclosure as shown in FIG. 16A.
Figure 18:
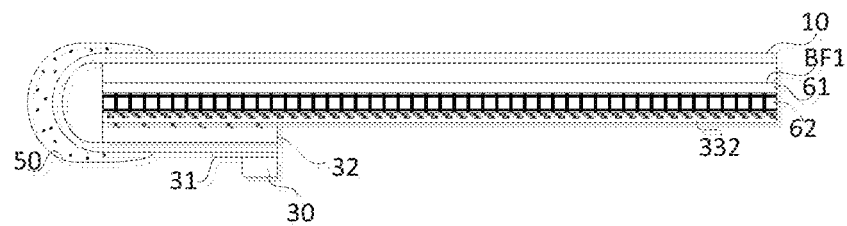
FIG. 18 is a cross-sectional view of the display module according to at least one embodiment of the present disclosure as shown in FIG. 17 after an MCL adhesive layer is added to the display module.

As shown in FIG. 16A, the second region includes a non-bent region and a bent region. The wave-absorbing material layer 32 is arranged in the non-bent region. During manufacture of the display module according to at least one embodiment of the present disclosure, after the multiplexing circuit 31, the driver integrated circuit 30, the first back film layer BF1, the wave-absorbing material layer 32, and the heat dissipation layer are formed on the display substrate 10, the display substrate 10 needs to be bent. As shown in FIG. 16B, the portion of the display substrate 10 corresponding to the bent region is bent along the fold-back direction S0. A cross-sectional view of the display module according to at least one embodiment of the present disclosure after the bending is as shown in FIG. 17. During practical operation, as shown in FIG. 18, after the display substrate 10 is bent, a micro coating layer (MCL) adhesive layer 50 needs to be provided at the bending position. The MCL adhesive layer 50 serves to protect the bent region.

Optionally, the thickness of the MCL adhesive layer 50 may be 0.09 millimeter (mm).

Figure 19:
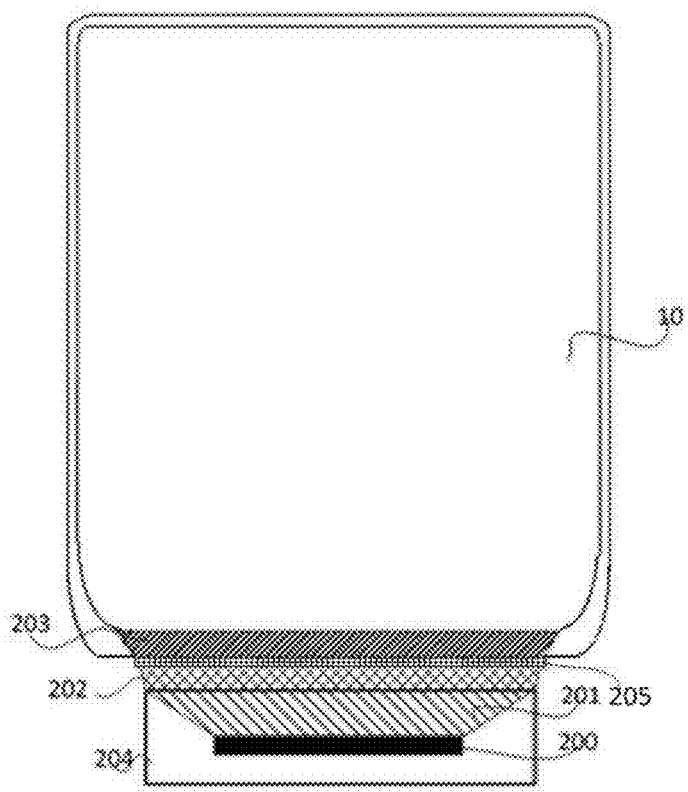
FIG. 19 is a schematic front view of the display module according to at least one embodiment of the present disclosure when the display substrate in the display module is not yet bent.

FIG. 19 is a schematic front view of the display substrate 10 when the display substrate 10 is not bent. In FIG. 19, the display substrate is denoted by 10, a first fan-out region is denoted by 203, a cell test region is denoted by 205, a bent region is denoted by 202, a second fan-out region is denoted by 201, a region where the driver integrated circuit (IC) is arranged is denoted by 200, and a region where the wave-absorbing material layer is arranged is denoted by 204 (this region is the region enclosed by a bold-lined box).

In FIG. 19, the cell test region 205 is arranged between the bent region 202 and the first fan-out region 203. During practical operation, the cell test region 205 may also be arranged between the second fan-out region 201 and the bent region 202.

As shown in FIG. 19, the region 204 where the wave-absorbing material layer is arranged exceeds the bent region 202. FIG. 19 is a schematic plan view of an unbent display panel. During practical operation, the wave-absorbing material layer needs to be bent to the backside of the display substrate 10. The wave-absorbing material layer is supported by the heat dissipation layer.

Figure 20:
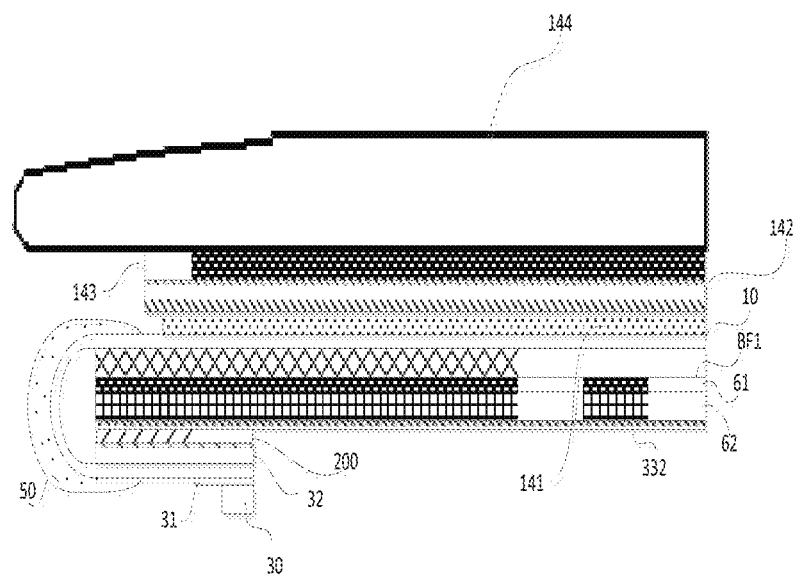
FIG. 20 is a cross-sectional view of a display module according to at least one embodiment of the present disclosure.

As shown in FIG. 20, after the display substrate 10 is bent, a bottom adhesive tape layer 141, a polarizer layer 142, a top adhesive tape layer 143, and a glass cover plate 144 may be arranged sequentially on the side of the display substrate 10 that is far away from the first back film layer BF1.

In a specific implementation, the bottom adhesive tape layer 141 and the top adhesive tape layer 143 may be made of optical adhesive.

In a specific implementation, in the display module according to at least one embodiment of the present disclosure as shown in FIG. 20, a spacer 200 may further be provided between the wave-absorbing material layer 32 and the second heat-dissipation film layer 332 to support the wave-absorbing material layer 32.

Optionally, the spacer 200 may be a PET spacer.

Figure 21:
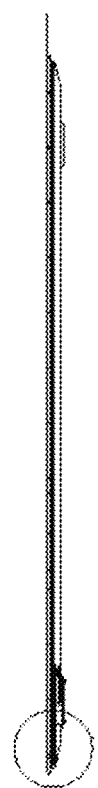
FIG. 21 is a diagram of a product stack corresponding to a display module according to at least one embodiment of the present disclosure.

FIG. 21 is a diagram of a product stack corresponding to a display module according to at least one embodiment of the present disclosure.

Figure 22:
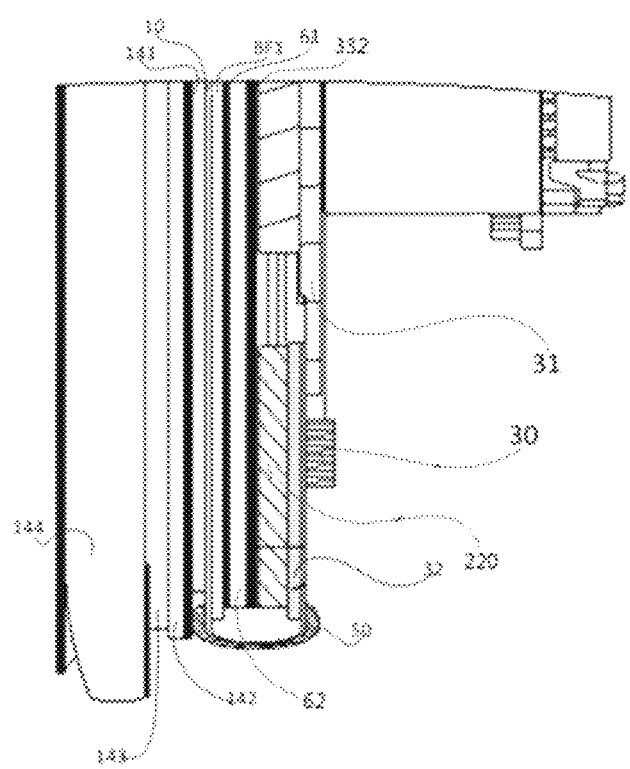
FIG. 22 is an enlarged sectional view of a portion within the circle in FIG. 21.

FIG. 22 is an enlarged sectional view of a portion within the circle in FIG. 21. As shown in FIG. 22, the wave-absorbing material layer is denoted by 32, the first back film layer is denoted by BF1, the mesh adhesive layer is denoted by 61, the buffer layer is denoted by 62, the second heat-dissipation film layer is denoted by 332, the PET spacer is denoted by 220, the display substrate is denoted by 10, the bottom adhesive tape layer is denoted by 141, the polarizer layer is denoted by 142, the top adhesive tape layer is denoted by 143, the glass cover plate is denoted by 144, the MCL adhesive layer is denoted by 50, the driver integrated circuit is denoted by 30, and the multiplexing circuit is denoted by 31.

The manufacture method of the display module according to at least one embodiment of the present disclosure includes: arranging a multiplexing circuit on a first surface of a display substrate; and forming a wave-absorbing material layer on a second surface of the display substrate, where the wave-absorbing material layer is configured to absorb electromagnetic wave interference signals, and the second surface is a surface opposite to the first surface.

In the display module according to at least one embodiment of the present disclosure, a wave-absorbing material layer used to absorb electromagnetic wave interference signals is arranged on a second surface of the display substrate, to absorb the electromagnetic wave interference signals generated by the multiplexing circuit and convert the electromagnetic wave interference signals into heat to be dissipated, thereby preventing the impact of the electromagnetic wave interference signals on reception of communication signals by the antenna included in the communication device.

In at least one embodiment of the present disclosure, the first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region.

The step of forming a wave-absorbing material layer on a second surface of the display substrate includes forming the wave-absorbing material layer in a first region on the second surface of the display substrate.

The step of arranging a multiplexing circuit on a first surface of the display substrate includes arranging the multiplexing circuit in the peripheral region on the first surface of the display substrate.

In at least one embodiment of the present disclosure, the display substrate may be a flexible display substrate. The first surface includes a display region and a peripheral region at a periphery of the display region. The second surface includes a first region and a second region. The orthographic projection of the display region onto the second surface overlaps the first region, and the orthographic projection of the peripheral region onto the second surface overlaps the second region. The second region includes a bent region and a non-bent region. The bent region is arranged between the non-bent region and the first region.

The step of forming a wave-absorbing material layer on a second surface of the display substrate includes arranging the wave-absorbing material layer in the non-bent region.

The step of arranging a multiplexing circuit on the first surface of the display substrate includes arranging the multiplexing circuit in the peripheral region on the first surface of the display substrate.

A communication device according to at least one embodiment of the present disclosure includes the display module according to at least one embodiment of the present disclosure.

The communication device according to at least one embodiment of the present disclosure may be a mobile terminal. The communication device according to at least one embodiment of the present disclosure may be any product or component with communication functions, such as a mobile phone, or a tablet computer.

Described above are only embodiments of the present disclosure. It should be noted that those of ordinary skill in the art can make improvements and modifications without departing from the principles of the present disclosure. These improvements and modifications shall also be deemed as falling within the scope of this disclosure.

What is claimed is:

1. A display panel, comprising a display substrate and pixel units, wherein a multiplexing circuit and the pixel units are arranged on a first surface of the display substrate, the display panel further comprises a wave-absorbing material layer arranged on a second surface of the display substrate, the wave-absorbing material layer is configured to absorb electromagnetic wave interference signals;
the second surface is a surface opposite to the first surface;
the multiplexing circuit comprises N input pins and M output pins, N is different from M, and N and M both are positive integers; and
the input pins are connected to a driver integrated circuit and the output pins are connected to the pixel units;
wherein the first surface comprises a display region and a peripheral region at a periphery of the display region; the second surface comprises a first region and a second region; an orthographic projection of the display region onto the second surface overlaps the first region, and an orthographic projection of the peripheral region onto the second surface overlaps the second region; the multiplexing circuit is arranged in the peripheral region;
the display panel further comprises a first back film layer arranged in the first region of the second surface; and
the wave-absorbing material layer is arranged on a side of the first back film layer that is far away from the display panel.

2. The display panel according to claim 1, further comprising a first heat-dissipation film layer, wherein the first heat-dissipation film layer and the wave-absorbing material layer are arranged at a same level, and an orthographic projection of the first heat-dissipation film layer onto the second surface and an orthographic projection of the wave-absorbing material layer onto the second surface are both in the first region.

3. The display panel according to claim 2, further comprising a second heat-dissipation film layer, wherein the second heat-dissipation film layer is arranged on a side of the first heat-dissipation film layer that is far away from the first back film layer; an orthographic projection of the second heat-dissipation film layer onto the second surface at least covers the orthographic projection of the first heat-dissipation film layer onto the second surface and the orthographic projection of the wave-absorbing material layer onto the second surface.

4. The display panel according to claim 3, wherein a thickness of the first heat-dissipation film layer is substantially equal to a thickness of the wave-absorbing material layer, the thickness of the first heat-dissipation film layer is substantially equal to a thickness of the first back film layer, the thickness of the first heat-dissipation film layer is greater than a thickness of the second heat-dissipation film layer, and the thickness of the second heat-dissipation film layer is greater than a thickness of the display substrate;
and/or,
a thickness of the first back film layer is greater than or equal to 0.05 mm and less than or equal to 0.1 mm, a thickness of the wave-absorbing material layer is greater than or equal to 0.03 mm and less than or equal to 0.15 mm, a thickness of the first heat-dissipation film layer is greater than or equal to 0.08 mm and less than or equal to 0.15 mm, a thickness of the second heat-dissipation film layer is greater than or equal to 0.03 mm and less than or equal to 0.05 mm, and a thickness of the display substrate is greater than or equal to 0.02 mm and less than or equal to 0.05 mm.

5. The display panel according to claim 1, further comprising a first heat-dissipation film layer and a second heat-dissipation film layer, wherein the first heat-dissipation film layer is arranged between the first back film layer and the wave-absorbing material layer; the second heat-dissipation film layer and the wave-absorbing material layer are arranged at a same level, and an orthographic projection of the first heat-dissipation film layer onto the second surface at least covers an orthographic projection of the second heat-dissipation film layer onto the second surface and an orthographic projection of the wave-absorbing material layer onto the second surface.

6. The display panel according to claim 5, wherein a thickness of the wave-absorbing material layer is substantially equal to a thickness of the second heat-dissipation film layer, a thickness of the first heat-dissipation film layer is substantially equal to a thickness of the first back film layer, the thickness of the first heat-dissipation film layer is greater than the thickness of the second heat-dissipation film layer, and the thickness of the second heat-dissipation film layer is greater than a thickness of the display substrate;

and/or, a thickness of the wave-absorbing material layer is greater than or equal to 0.03 mm and less than or equal to 0.15 mm, a thickness of the second heat-dissipation film layer is greater than or equal to 0.03 mm and less than or equal to 0.05 mm, a thickness of the first heat-dissipation film layer is greater than or equal to 0.08 mm and less than or equal to 0.15 mm, a thickness of the first back film layer is greater than or equal to 0.05 mm and less than or equal to 0.1 mm, and a thickness of the display substrate is greater than or equal to 0.02 mm and less than or equal to 0.05 mm.

7. The display panel according to claim 1, wherein the wave-absorbing material layer comprises one or more of a ferrite layer, a magnetic ferrous nanomaterial layer, a carbon fiber layer, a carbon nanotube layer, or a silicon carbide layer.

8. The display panel according to claim 1, wherein the display substrate is a flexible display substrate; the first surface comprises a display region and a peripheral region at a periphery of the display region; the second surface comprises a first region and a second region; an orthographic projection of the display region onto the second surface overlaps the first region, an orthographic projection of the peripheral region onto the second surface overlaps the second region; the multiplexing circuit is arranged in the peripheral region;

the second region comprises a bent region and a non-bent region;

the bent region is arranged between the non-bent region and the first region; and the wave-absorbing material layer is arranged in the non-bent region.

9. The display panel according to claim 1, further comprising an upper antenna, a lower antenna and a plurality of data lines longitudinally arranged on the display substrate;

wherein the upper antenna is arranged above the display substrate and the lower antenna is arranged below the display substrate; data voltage signals provided by the multiplexing circuit are output through the data lines, and the wave-absorbing material layer is used to absorb the electromagnetic wave interference signals generated by the multiplexing circuit.

10. A display module, comprising a multiplexing circuit and the display panel according to claim 1;

wherein the multiplexing circuit is arranged on the first surface of the display substrate comprised in the display panel.

11. The display module according to claim 10, further comprising a driver integrated circuit, wherein the driver integrated circuit is arranged on a side of the multiplexing circuit that is far away from the display substrate.

12. The display module according to claim 10, further comprising a bottom adhesive tape layer, a polarizer layer, a top adhesive tape layer, and a cover plate, wherein the bottom adhesive tape layer, the polarizer layer, the top adhesive tape layer, and the cover plate are arranged sequentially on a side of the display substrate that is far away from the first back film layer.

13. A communication device, comprising the display module according to claim 10.

* * * * *